United States Patent
Shen et al.

(10) Patent No.: US 10,030,303 B2
(45) Date of Patent: Jul. 24, 2018

(54) SPUTTER TOOL

(71) Applicants: SunPower Corporation, San Jose, CA (US); Total Marketing Services, Puteaux (FR)

(72) Inventors: Yu-Chen Shen, Sunnyvale, CA (US); Taiqing Qiu, Los Gatos, CA (US); Robert Woehl, San Jose, CA (US); Kieran Mark Tracy, San Jose, CA (US); Mukul Agrawal, Fremont, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 88 days.

(21) Appl. No.: 14/578,332

(22) Filed: Dec. 19, 2014

(65) Prior Publication Data

US 2016/0177439 A1     Jun. 23, 2016

(51) Int. Cl.
C23C 14/34      (2006.01)
C23C 14/50      (2006.01)
(Continued)

(52) U.S. Cl.
CPC ............ *C23C 14/50* (2013.01); *C23C 14/165* (2013.01); *C23C 14/34* (2013.01); *C23C 14/3464* (2013.01); *H01J 37/32715* (2013.01)

(58) Field of Classification Search
CPC ................................................ H01J 37/32715
See application file for complete search history.

(56) References Cited

U.S. PATENT DOCUMENTS

2007/0012558 A1 *  1/2007  White ................ C23C 14/35
                                              204/192.1
2008/0102001 A1 *  5/2008  Chandrachood .. H01J 37/32935
                                              422/129
(Continued)

FOREIGN PATENT DOCUMENTS

JP    2002212734    7/2002
KR    20130114302   10/2013
(Continued)

OTHER PUBLICATIONS

International Search Report and Written Opinion for Application No. PCT/US2015/066514, dated Apr. 8, 2016, 12 pages.

*Primary Examiner* — Jason Berman
(74) *Attorney, Agent, or Firm* — Schwabe, Williamson & Wyatt, P.C.

(57) ABSTRACT

Sputter tools are described. In one embodiment, an apparatus to support a wafer includes a pallet having a depression to receive the wafer. The pallet includes an opening below the depression, and an edge in the depression is to support the wafer over the opening. A cover at least partially covers the opening. In one example, the cover may be a plate with one or more holes, and a pipe may be located below each of the holes in the cover. In one embodiment, a wafer-processing system includes a processing chamber and a pallet with a depression to receive a wafer. The pallet has an opening below the depression, and an edge in the depression supports the wafer over the opening. In one such embodiment, a cover at least partially covers the opening. According to one embodiment, an energy-absorbing material is disposed below the opening in the pallet.

19 Claims, 8 Drawing Sheets

(51) Int. Cl.
*H01J 37/32* (2006.01)
*C23C 14/16* (2006.01)

(56) References Cited

U.S. PATENT DOCUMENTS

| | | | |
|---|---|---|---|
| 2008/0230372 A1* | 9/2008 | Cousins | C23C 14/50 204/192.1 |
| 2010/0078899 A1* | 4/2010 | Povolny | H01J 37/32642 279/128 |
| 2013/0048217 A1* | 2/2013 | Shiraiwa | H01L 21/67109 156/345.53 |
| 2013/0255578 A1 | 10/2013 | Sakong et al. | |

FOREIGN PATENT DOCUMENTS

| | | |
|---|---|---|
| WO | WO-0030155 | 5/2000 |
| WO | WO-2008115325 | 9/2008 |

* cited by examiner

SPUTTER TOOL

TECHNICAL FIELD

Embodiments of the present disclosure are in the field of wafer processing, and in particular, metal seed deposition for solar cells using a sputter tool.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Furthermore, performance and stability in the field are typically also important characteristics.

Accordingly, techniques for increasing the efficiency, field performance and stability, or techniques for increasing the efficiency in the manufacture of solar cells, are generally desirable.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled." The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper," "lower," "above," and "below" refer to directions in the drawings to which reference is made. Terms such as "front," "back," "rear," "side," "outboard," and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit." As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Sputter tools are described herein. In the following description, numerous specific details are set forth, such as specific sputter tool pallets, in order to provide a thorough understanding of embodiments of the present disclosure. It will be apparent to one skilled in the art that embodiments of the present disclosure may be practiced without these specific details. For example, embodiments described herein may apply to other wafer processing systems (e.g., other plasma-based etch or deposition systems). In other instances, well-known fabrication techniques, such as metal seed sputter techniques, are not described in detail in order to not unnecessarily obscure embodiments of the present disclosure. Furthermore, it is to be understood that the various embodiments shown in the figures are illustrative representations and are not necessarily drawn to scale.

As mentioned above, field performance and stability are typically important characteristics of a solar cell. One issue affecting performance in the field is the UV behavior of the solar cell. UV behavior generally refers to how exposure to UV radiation affects the solar cell over time, and in particular, how the solar cell degrades over time. A solar cell that has experienced UV degradation typically has a reduction in $V_{OC}$ (open circuit voltage). The manufacturing process has the potential to result in defects which affect the UV degradation of a solar cell. Some solar cell technologies may be more susceptible to UV degradation than others, and therefore may benefit from manufacturing techniques which improve UV behavior.

Figure 1:
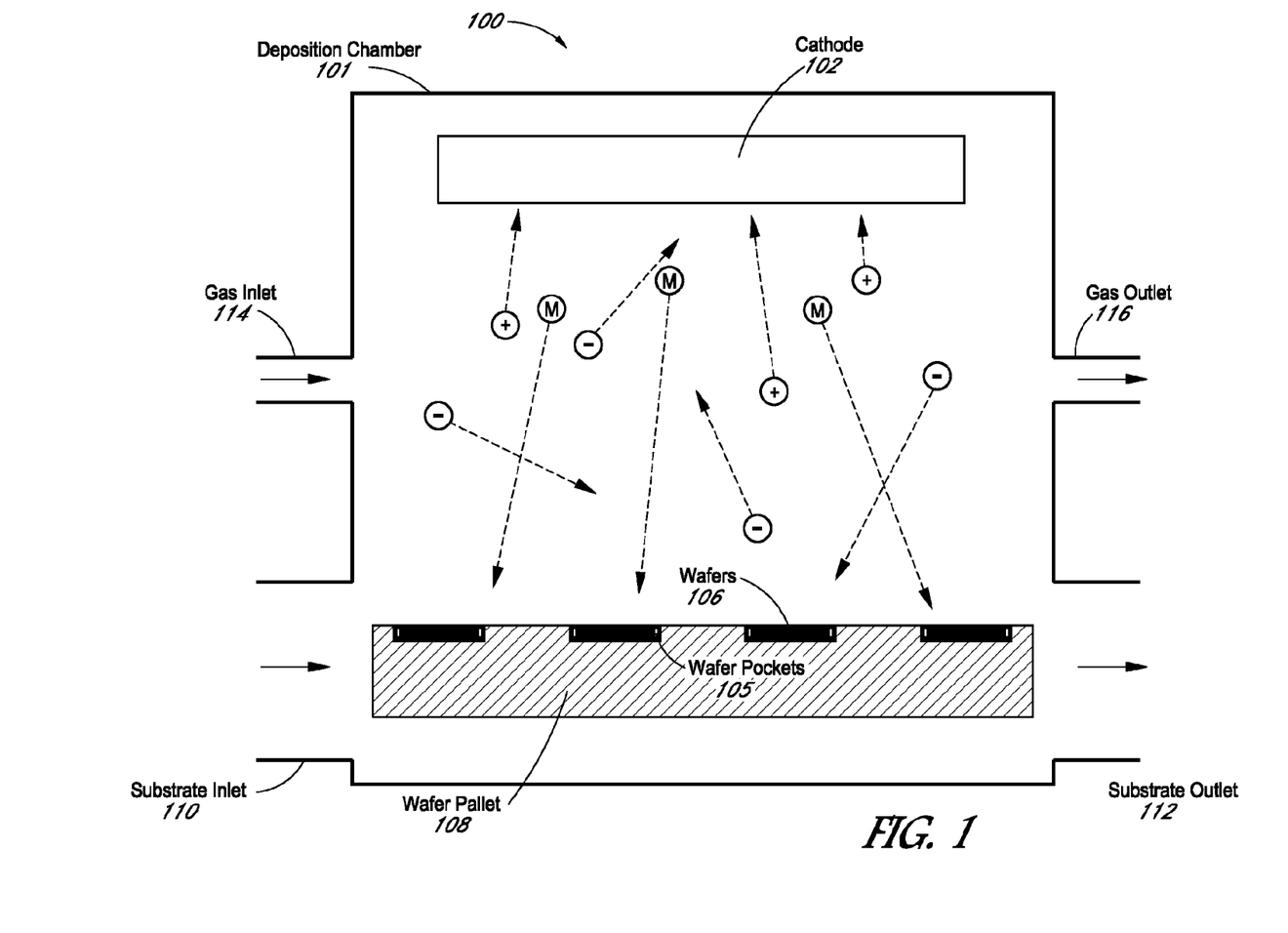
FIG. 1 is a diagram of a sputter tool, in accordance with an embodiment of the present disclosure.

One particular manufacturing technique that appears to have an impact on UV behavior is metal seed formation using a sputter tool or other deposition system. FIG. 1 illustrates one example of a deposition system 100 that may be used to form a metal seed layer. The deposition system 100 may be a pass-through deposition system. The illustrated deposition system 100 includes a deposition chamber 101. A cathode 102 inside the deposition chamber 101 includes one or more targets. The targets include material to be deposited, via sputter gas ions (designated with a "+"), onto one or more wafers 106. In one embodiment, the cathode 102 is coupled to a magnetron sputter source (not shown) which is used to generate strong electromagnetic fields around the cathode 102 to produce collisions resulting in the sputter gas ions. The sputter gas ions impact the cathode and cause target material to eject (ejected target material is designated with an "M") and deposit on the surface of the wafers 106. The deposition material may also deposited on other surfaces throughout the deposition chamber 101 because of the vacuum within the deposition chamber 101. Exemplary deposition materials for the target include aluminum (Al), tungsten (W), titanium tungsten (TiW), nickel (Ni), and copper (Cu), although other deposition materials may be used. The sputter gas ions are typically argon ions, or ions from another inert gas. However, some embodiments of the deposition system 100 may implement reactive operations such as $O_2$ and $N_2$ processes for oxides and nitrides. The wafers 106 may be a material on which the deposition material may be deposited.

In one embodiment, the wafers 106 are transported through the deposition chamber 101 by a wafer pallet 108 (also referred to herein as a "pallet"). The illustrated wafer pallets 108 includes wafer pockets 105 (also referred to herein as "depressions") to hold the wafers 106. One or more robots may be used to load the wafers 106 onto the pallet 108 and unload the wafers 106 from the pallet 108 after processing. The wafers 106 may be loaded onto the wafer pallet 108 such that the side onto which material is to be deposited is facing "up" (e.g., facing the inside of the deposition chamber 101 and therefore exposed to the deposition material), and the opposite side is facing "down" (e.g., facing the wafer pallet 108 and away from the deposition material). For example, in an embodiment in which the system 100 is used to form a metal seed layer on a back side of the wafers 106 (e.g., to form back-contact solar cells), the wafers 106 would be loaded onto the wafer pallet 108 with the front side "down" and the back side "up." Although the following description includes examples that refer to back-contact solar cells, the embodiments described herein may also be applicable to other wafers.

The system 100 may further include load locks (not shown) and differential pumping (not shown) to establish a vacuum for processing the wafers. The deposition chamber 101 is configured to allow the wafer pallet 108 to enter the deposition chamber 101 through a substrate inlet 110 and to exit the deposition chamber 101 through a substrate outlet 112. For example, the wafer pallet 108 may move along a track (not shown) that automatically transports the wafer pallet 108 through the deposition chamber 101. Alternatively, the wafers 106 may be manually inserted into and removed from the deposition chamber 101. Additionally, the deposition chamber 101 includes a gas inlet 114 and a gas outlet 116 to allow the sputter gas (e.g., argon) to enter and exit the deposition chamber 101. Other embodiments of the deposition system 100 may include additional or different components or features.

As mentioned above, metal seed formation using a sputter tool (such as the system 100 of FIG. 1) may result in high UV degradation in resulting solar cells. A possible reason for high UV degradation is that sputter gas ions (e.g., Ar+) are reaching the front side of the wafer, resulting in damage to the front side. Another possibility is that metal ions, which are supposed to be deposited on the back side of the wafer, are reaching the front side of the wafer, resulting in damage. Yet another possibility is that x-rays and/or UV rays from the sputter tool operation are hitting the front side of the wafer. Another possibility is that sputtered electrons may hit the front side of the wafer, resulting in damage. Thus, it is possible that a variety of ions, particles, and/or high energy rays resulting from operation of the sputter tool are unintentionally reaching the front side of the wafer and causing damage. The damage caused may then result in greater UV degradation of the solar cells.

Another possibility is that charges collect on the front side, forming a bias voltage across the solar cell. The bias may result in leakage current going through the front surface, which may alter the solar cell (e.g., may result in passivation changes on the front side). Embodiments herein may address one or more of the above-mentioned issues to reduce the UV degradation of solar cells.

Disclosed herein are apparatuses to support a wafer in a wafer-processing system, such as a sputter tool. In one embodiment, the apparatus includes a pallet with a depression to receive a wafer. The pallet includes an opening below the depression, and an edge in the depression supports the wafer over the opening. The apparatus further includes a cover to at least partially cover the opening. In one example, the cover may be a plate with one or more holes, and a pipe may be located below each of the holes in the cover.

In one embodiment, the apparatus includes a pallet to support the wafer in a processing chamber and a "UV-trap" below the pallet. The UV-trap includes a plurality of vertical walls below the pallet. The vertical walls have a height and spacing to enable UV rays to reflect between the walls multiple times before exiting spaces between the walls.

According to one embodiment, the apparatus includes a pallet having deeper "pockets" (depressions) to hold the wafers. The depressions are sized to receive the wafers, and have a depth substantially greater than the thickness of the wafer.

Also disclosed herein are wafer-processing systems. In one embodiment, the system includes a processing chamber and a pallet. The pallet includes a depression to receive the wafer and an opening below the depression. An edge in the depression is to support the wafer over the opening. In one such embodiment, a cover at least partially covers the opening. According to one embodiment, the system further includes an energy-absorbing material disposed below the opening in the pallet.

As is explained in further detail below, embodiments of the present disclosure may reduce damage to the wafer during processing, and thus improve the efficiency and performance of the devices formed on the wafer. The embodiments mentioned above, as well as additional embodiments not mentioned above, are described in greater detail in the following description.

Figure 2:
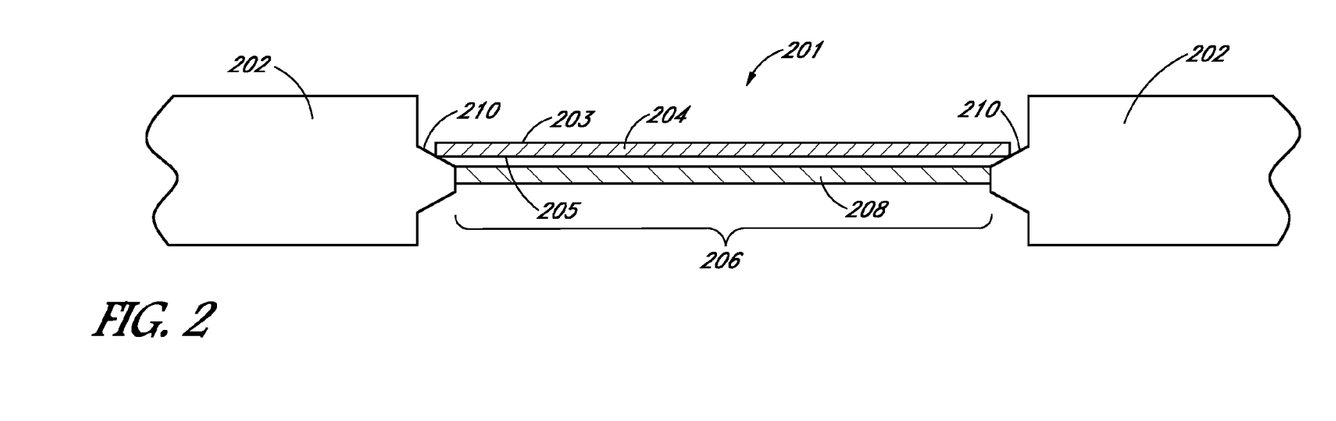
FIG. 2 is a cross-sectional view of a pallet to support a wafer in a wafer-processing system, in accordance with an embodiment of the present disclosure.

Turning again to the figures, FIGS. 2-5 and 7A-7B illustrate embodiments of pallets to support wafers in a wafer-processing system. FIG. 2 is a cross-sectional view of a pallet to support a wafer in a wafer-processing system, in accordance with one embodiment of the present disclosure. In the illustrated embodiment, the pallet 202 has a depression 201 to receive the wafer 204. The wafer 204 may be any material to be processed in a process chamber. In one example, the wafer 204 may include a stack of materials such as in the exemplary solar cell illustrated in FIG. 9.

Figure 9:
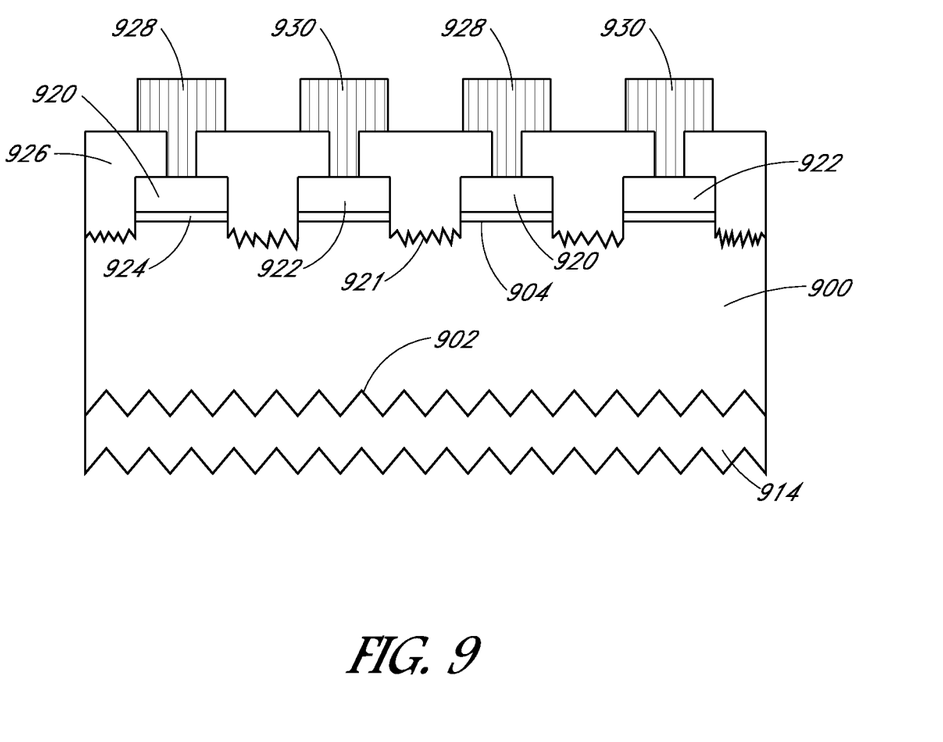
FIG. 9 illustrates a cross-sectional view of an example solar cell, in accordance with an embodiment of the present disclosure.

FIG. 9 illustrates a cross-sectional view of a back-contact solar cell having emitter regions formed above a back surface 904 of a substrate, in accordance with an embodiment of the present disclosure.

Referring to FIG. 9, the solar cell includes a silicon substrate 900 having a light-receiving surface 902. An anti-reflective coating (ARC) layer 914 is disposed on the light-receiving surface 902. In an embodiment, the ARC layer includes silicon nitride. Other embodiments may include other front side layers that may benefit from the techniques described herein.

Referring again to FIG. 9, on the back surface of the substrate 900, alternating P-type 920 and N-type 922 emitter regions are formed. In one such embodiment, trenches 921 are disposed between the alternating P-type 920 and N-type 922 emitter regions. More particularly, in an embodiment, first polycrystalline silicon emitter regions 922 are formed on a first portion of a thin dielectric layer 924 and are doped with an N-type impurity. Second polycrystalline silicon emitter regions 920 are formed on a second portion of the thin dielectric layer 924 and are doped with a P-type impurity. In an embodiment the tunnel dielectric 924 is a silicon oxide layer.

Referring again to FIG. 9, conductive contact structures 928/930 are fabricated by first depositing and patterning an insulating layer 926 to have openings and then forming one or more conductive layers in the openings. In an embodiment, the conductive contact structures 928/930 include metal and may be formed by a variety of processes, which may include deposition of a metal seed layer. Deposition of the metal seed layer may involve a sputtering process such as described above with respect to FIG. 1. When depositing the metal seed layer, the front surface layers may be susceptible to damage from ions, particles, and/or high energy rays, and may therefore benefit from the techniques described herein. The conductive contact structures 928/930 may be formed by further processing including a deposition, lithographic, and etch approach or, alternatively, a printing or plating process or, alternatively, a foil adhesion process.

Returning to FIG. 2, the depression 201 receives the wafer 204. In one embodiment, the depression 201 is sized to allow the wafer 204 to be inserted into the depression 201. For example, in the illustrated embodiment, the dimensions of the depression 201 are slightly larger than the dimensions of the wafer 204 so that the top surface of the wafer 204 is slightly below the top of the pallet 202. In other embodiments, the depression may have other dimensions. For example, the pallet may have a deep depression (as depicted in FIG. 7B), or the depression 201 may have slightly smaller dimensions than the wafer 204 to allow the top surface of the wafer 204 to be at or above the top of the pallet 202. Thus, in embodiments, the depression holds the wafer 204 in place on the pallet 202 during processing.

In some embodiments, the pallet 202 may include other mechanisms to hold the wafer 204 (in addition to, or instead of, pockets). For example, vertical pins may be used with or independently of the depression 201. In other embodiments, the pallet 202 may be constructed without wafer pockets. For example, the pallet 202 may include a flat surface and another mechanism for holding wafers in place during processing, such as a number of pins or clips to hold the wafers in a predefined arrangement.

The illustrated pallet 202 further includes an opening 206 below the depression 201. The opening 206 is a hole, or void, aligned with the depression 201. In one embodiment, the dimensions of the opening 206 are smaller than the dimensions of the depression 201 so that a surface is present within the depression 201 to support the wafer 204. For example, edges 210 in the depression 201 support the wafer 204 over the opening 206. As illustrated, the edges 210 are a ledge or lip having a downward slanted top surface sized to support the wafer 204. Thus, in the illustrated example, the wafer 204 sits over the opening 206 on the top surface of a trapezoidal prism-shaped ledge or lip. The edges 210 may be shaped and/or sized differently in other embodiments. For example, the edges 210 may be flat and approximately parallel with the top surface of the pallet 202. In another embodiment, the edges 210 slant downward, but may part of a ledge or lip with a beveled edge rather than a prism-shaped ledge or lip.

The opening 206 may facilitate loading and unloading the wafer 204 into the depression 201. For example, the opening 206 may be a hole that extends through the entire thickness of the pallet 202. The opening 206 may be sufficiently large to receive a pedestal (or other loading/unloading mechanism) to load and unload the wafer. For example, a loading mechanism may extend through the opening 206 to a point above the top surface of the pallet 202. A user or automated robot may place the wafer 204 on the loading mechanism, and the loading mechanism may then lower the wafer 204 into the depression 201 as the loading mechanism is retracted from the opening 206. Unloading may involve the reverse process, in which the loading (unloading) mechanism rises through the opening 206 to contact the wafer 204, and lifts the wafer 204 above the pallet 202.

In addition to facilitating loading and unloading, the opening 206 may facilitate ventilation of water vapor or other gasses within the processing chamber. Thus, the opening 206 may be useful for automation as well as for effective pumping out of adsorbed moisture on the wafer 204. Although a single opening 206 is illustrated in FIG. 2, other embodiments may include no openings, or more than one opening. While the opening 206 in the pallet 202 may enable automation and ventilation, the opening 206 may also enable undesirable exposure of the front side 205 of the wafer to ions, particles, and/or high energy rays.

In one embodiment, a cover 208 at least partially covers the opening 206 in the pallet 202. In the embodiment illustrated in FIG. 2, the cover 208 is shown as completely covering the opening 206. However, FIGS. 3 and 4, which are described in more detail below, illustrate embodiments including covers with holes.

Turning again to FIG. 2, the cover 208 is disposed in the depression 201 over the opening 206 and below the wafer 204. Thus, the side 203 of the wafer that is being processed is facing up, and the cover is below the side 205 of the wafer 204 that is not being processed. The cover 208 may or may not contact (or may partially contact) the wafer 204. For example, in the illustrated embodiment, the cover 208 is supported on the edges 210 in the depression 201 in a plane below the wafer 204. In the illustrated embodiment, the cover is coupled to the edges 210 in a position lower than the wafer 204 to form a gap between the cover 208 and the wafer 204. The cover 208 may be attached (e.g., permanently attached or removably attached via a fastening mechanism removably attached with a fastening mechanism) to the pallet 202, or may rest on the edges 210 under the wafer 204 without being attached. In the illustrated embodiment, a separate plate covers each wafer opening.

In other embodiments, the cover 208 may reside in a different location than illustrated in FIG. 2. For example, the cover 208 may be coupled to the edges 210 in a position to contact the wafer 204. In another embodiment, the cover 208 may be a single plate (a sub-pallet) positioned below the pallet 202. In one such embodiment, a single plate may be positioned below the bottom of the pallet 202 to at least partially cover a plurality of wafer openings. The cover 208 may be solid or patterned. In one embodiment, the cover includes a metal plate (e.g., an aluminum plate or other metal plate). The cover 208 may also be made from another material, such as silicon, plastic, or another suitable material. According to one embodiment, the cover 208 includes a grid pattern.

As mentioned above, in one example, the wafer 204 may be a solar cell stack onto which a metal seed layer is deposited. In one such embodiment, forming the metal seed layer with a sputter tool using such a closed-pocket pallet may result in significant improvements in UV behavior. However, closing the opening 206 with the cover 208 may limit automation.

Figure 3:
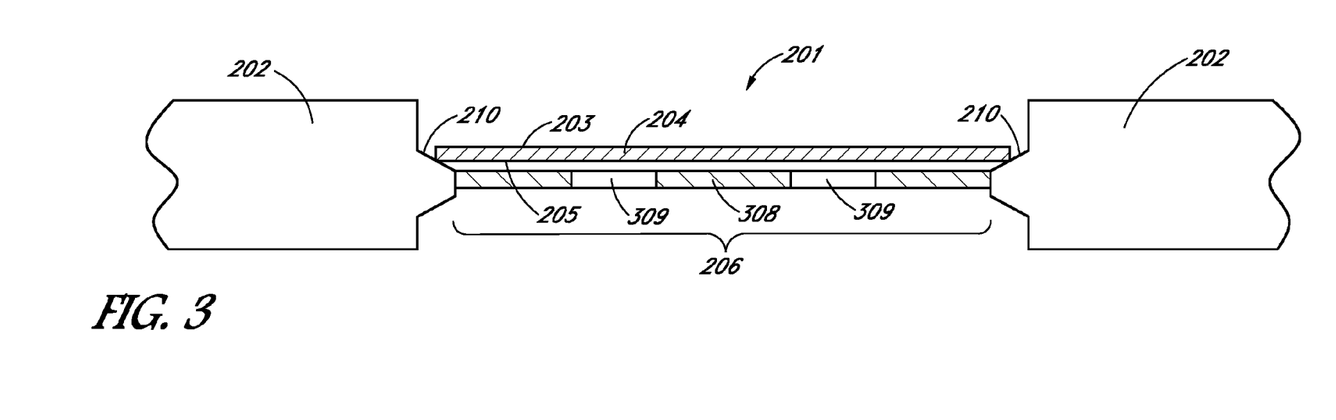
FIG. 3 is a cross-sectional view of a pallet to support a wafer in a wafer-processing system, in accordance with an embodiment of the present disclosure.

FIG. 3 is a cross-sectional view of a pallet to support a wafer in a wafer-processing system, in accordance with another embodiment of the present disclosure. In the embodiment illustrated in FIG. 3, the cover 308 may be similar to the cover 208 of FIG. 2, except that the cover 308 includes one or more holes 309. For example, as illustrated in FIG. 3, the cover 308 includes a plate with two holes 309.

In one embodiment, the holes 309 have a size through which water vapor can pass. The holes 309 may further be sized to enable automation (e.g., to enable loading/unloading mechanisms to pass through the holes 309). The shape of the holes may be round, rectangular, or another custom shape (e.g., a hole that has a shape that is suitable for the loading/unloading mechanism to pass through). Pallets that include covers with holes to cover the opening 206 may enable improved UV performance similar to the embodiment in FIG. 2, while retaining automation access holes. Other embodiments may include covers with a different number, size, and/or shape of hole. For example, the cover 308 may include a single hole or more than two holes. In another example, the holes 309 may be smaller or larger than illustrated in FIG. 3. For example, the holes may be too small for a loading/unloading mechanism to pass though, but may be large enough for water vapor or other gases to pass through. In another example, a hole in the cover 308 may be larger than depicted in FIG. 3, but still provide some protection to the front side of the wafer 204.

In one embodiment, a wafer processing system further includes a heating element configured to heat the pallet 202, cover 208, and/or wafer 204. For example, the pallet 202 and/or cover 208 may include an embedded heating element (e.g., a resistive heating element). Heating the pallet 202 may reduce water vapor on the pallet and the wafer, which may reduce damage to the wafer and improve the UV characteristics of the wafer.

Figure 4:
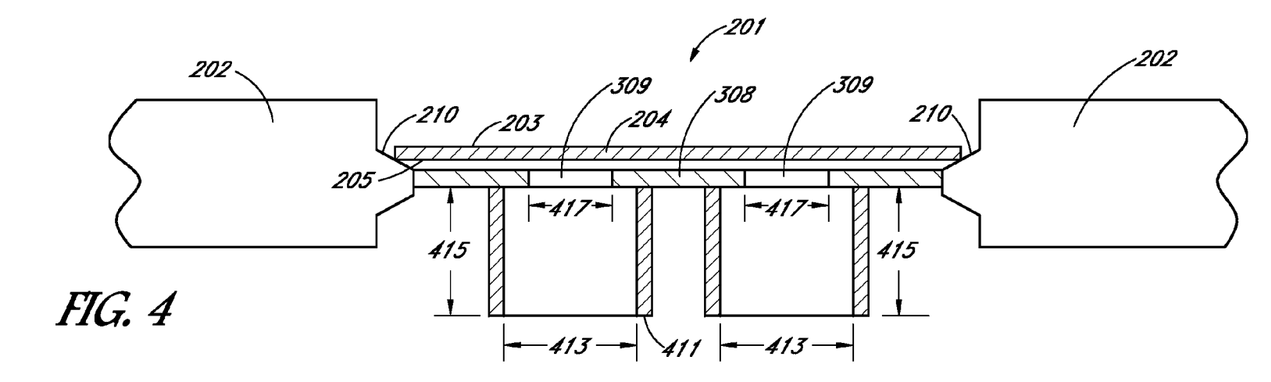
FIG. 4 is a cross-sectional view of a pallet to support a wafer in a wafer-processing system, in accordance with an embodiment of the present disclosure.

FIG. 4 is a cross-sectional view of a pallet to support a wafer in a wafer-processing system, in accordance with another embodiment of the present disclosure. The pallet 202 and cover 308 illustrated in FIG. 4 may be similar to, or the same as, the embodiments illustrated in FIG. 3, with the addition of a pipe (e.g., tube) 411 located below each of the holes 309 in the cover 308. In one embodiment, the pipes 411 are cylindrical. Other embodiments may include pipes having other shapes, such as pipes having rectangular or other geometric cross-sections. Each pipe 411 is oriented relative to the corresponding hole such that the openings of the pipe are aligned with and located under the corresponding hole 309 in the cover 308. The pipes 411 may be made from metal, ceramic, plastic, and/or other suitable materials. In one embodiment, the pipes 411 are made from the same material as the cover 308. The pipes 411 may be attached to the cover 308 (e.g., permanently attached to form a single piece with the cover 308, or removably attached via a fastening mechanism), or separate from the cover 308.

The dimensions of the pipes 411 may depend on the size and location of the cover 308 and the holes 309, as well as the dimensions of other components of the sputter tool. For example, according to one embodiment, the diameter 413 of the pipe 411 below each hole 309 is greater than or approximately equal to the diameter 417 of the corresponding hole 309 in the cover. In one embodiment, the height 415 of the pipe 411 is approximately equal to or greater than the diameter of the corresponding hole 309 in the cover. Embodiments may provide protection from damage to the wafer 204, while still enabling automation and/or ventilation.

Figure 5:
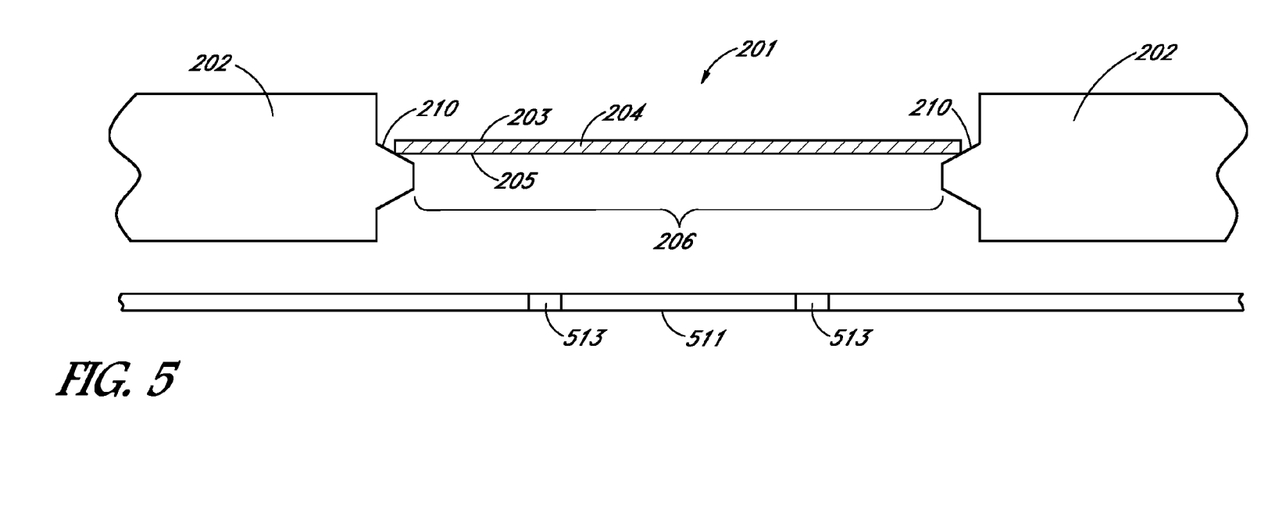
FIG. 5 is a cross-sectional view of a pallet to support a wafer in a wafer-processing system and an energy-absorbing plate located below the pallet, in accordance with an embodiment of the present disclosure.

FIG. 5 is a cross-sectional view of a pallet to support a wafer in a wafer-processing system, and an energy-absorbing material located below the pallet, in accordance with an embodiment of the present disclosure. As illustrated in FIG. 5, the energy-absorbing material is a plate 511 disposed below the pallet 202. The plate 511 may include a UV or other high-energy absorbing material. In one embodiment, the plate 511 is made from, or includes, silicon or graphite.

In one embodiment, the plate 511 has a size equal to or larger than the pallet 202. In another embodiment, the plate 511 has dimensions smaller than the pallet 202, but large enough to prevent a significant amount of the UV or other high-energy radiation from reaching the front surface of the wafer 204. The plate may be stationary relative to the chamber (e.g., the deposition chamber 101 of FIG. 1). In one such embodiment, the pallet 202 is to move over the plate 511. When the pallet 202 is in position for processing of the wafers, the plate 511 may be disposed directly below and in contact with the pallet 202, or separate from the pallet 202. In one embodiment, the plate 511 include openings (e.g., holes) 513, which may enable automated loading and unloading of the wafer 206.

According to embodiments, an energy-absorbing material disposed below the pallet may reduce damage to the front side of the wafer by absorbing UV rays that may otherwise reach the front side of the wafer. Therefore, embodiments including an energy-absorbing material below the pallet may improve UV characteristics of the wafer. Although FIG. 5 illustrates a pallet 202 with uncovered pockets, an energy-absorbing material may also be included in embodiments with closed pockets and/or pipes (e.g., such as the embodiment depicted in FIG. 4 with the cover 308 and pipes 411).

Figure 6:
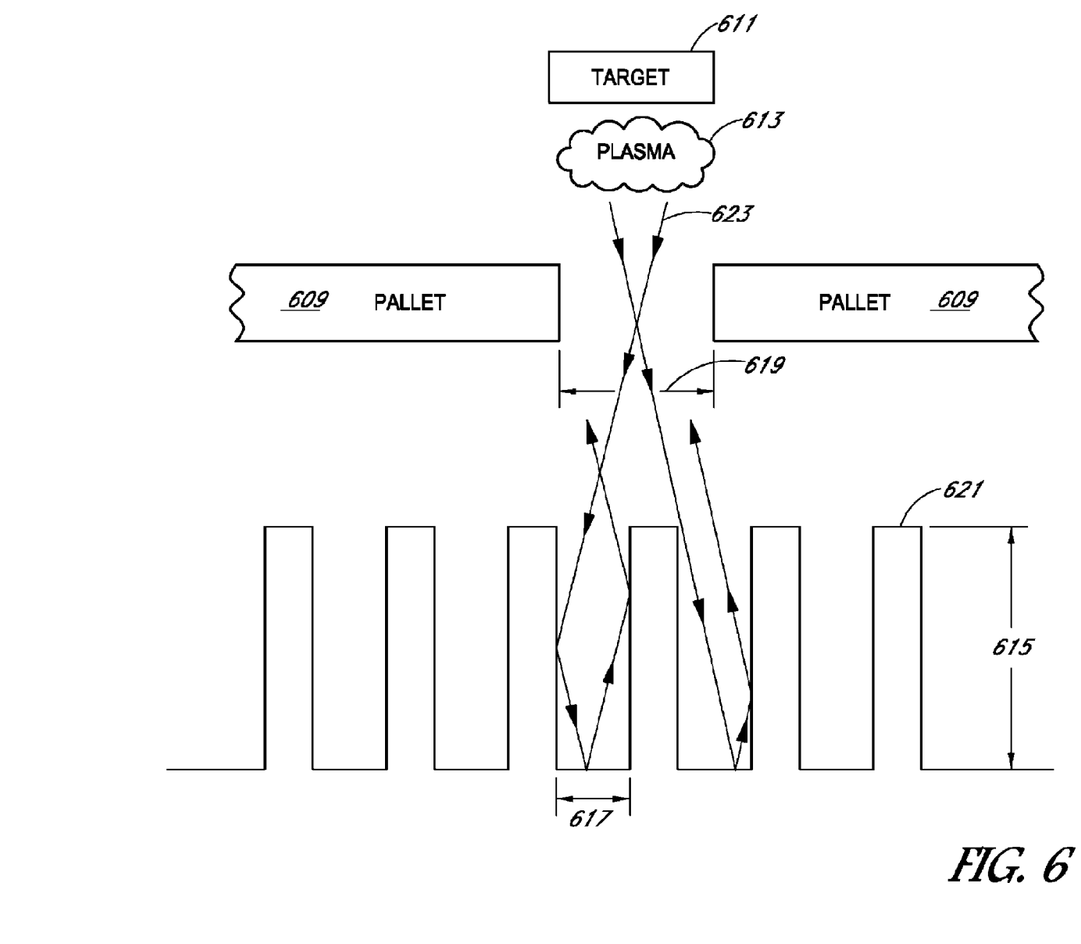
FIG. 6 is a cross-sectional view of pallets to support wafers in a wafer-processing system and a UV-trap located below the pallets, in accordance with an embodiment of the present disclosure.

FIG. 6 is a cross-sectional view of pallets to support wafers in a wafer-processing system and a UV-trap located below the pallets, in accordance with an embodiment of the present disclosure. In the embodiment illustrated in FIG. 6, the pallets 609 are to support wafers in a processing chamber (e.g., the deposition chamber 101 of FIG. 1). Pallets may be separated from one another by a gap 619. The illustrated embodiment includes a target 611 (which may be similar to or the same as the cathode 102 described above with respect to FIG. 1). During processing, plasma 613 is generated in the chamber, which may result in UV rays 623 or other high energy radiation. The UV rays 623 may travel through the gap 619 between the pallets 609.

In one embodiment, a structure including a plurality of vertical walls 621 is located below the pallets 609. The vertical walls 621 of the structure have a height 615 and spacing 617 to enable UV rays 623 to reflect between the walls 621 multiple times before exiting the spaces between the walls 621. The vertical walls 621 of the UV trap may be formed from metal, plastic, or other suitable material. When the UV rays reflect back and forth between the walls of the trap, the intensity of the UV rays diminishes. Diminishing the UV radiation may decrease the UV radiation that is reflected back to the wafer, which may reduce damage to the wafer. Thus, embodiments including a UV trap may result in improved UV behavior in the wafers.

Figure 7A:
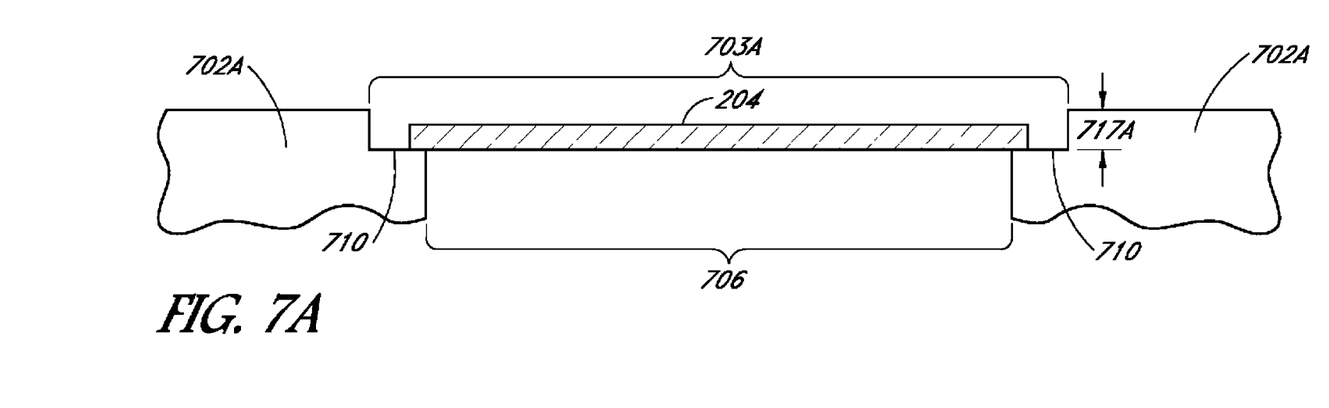
FIG. 7A is a cross-sectional view of a pallet to support a wafer in a wafer-processing system, in accordance with an embodiment of the present disclosure.
Figure 7B:
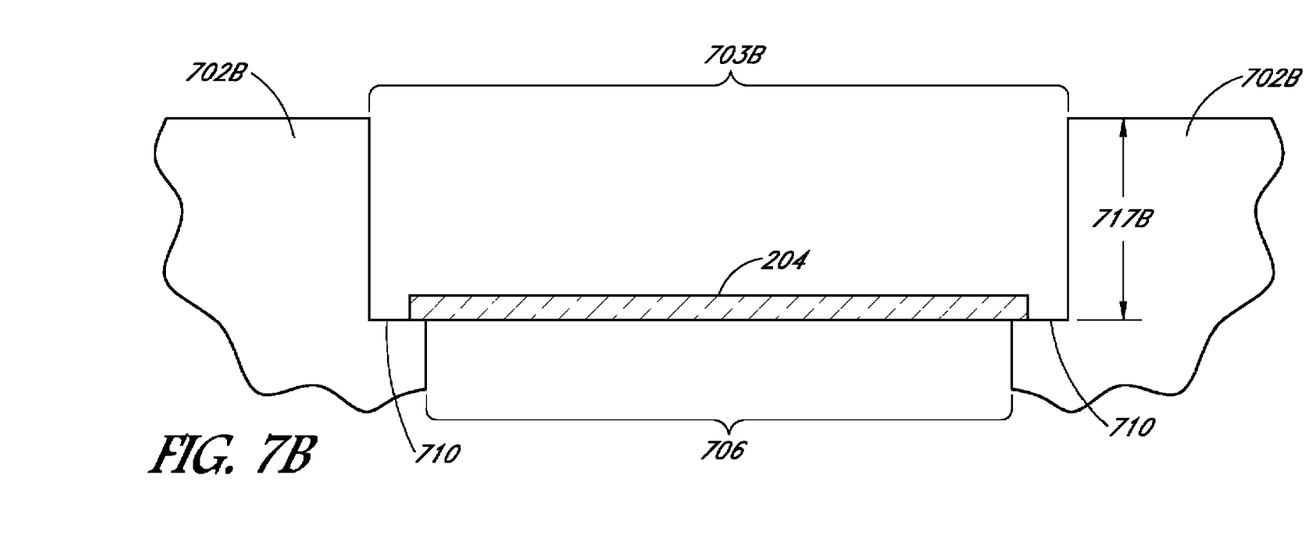
FIG. 7B is a cross-sectional view of a pallet with a deeper pocket to support a wafer in a wafer-processing system, in accordance with an embodiment of the present disclosure.

FIGS. 7A and 7B are cross-sectional views of pallets to support wafers in a wafer-processing system, in accordance with embodiments of the present disclosure. The pallets 702A and 702B each have a depression 703A and 703B, respectively. Similar to the pallet 202 of FIG. 2, the pallets 702A and 702B each include an opening 706 below the depression 703A and 703B, respectively. The substrate 204 is supported over the openings 706 by edges 710. However, the pallet 702B of FIG. 7B has a deeper pocket 703B than the pallet 702A of FIG. 7A. The depression 703A has a depth 717A that is slightly greater than the wafer 204 to be processed, resulting in the wafer 204 being slightly recessed in the pallet 702A. However, as mentioned above, other embodiments may have even shallower pockets or may have no pockets.

In contrast, according to the embodiment illustrated in FIG. 7B, the pallet 702B has a deep pocket. For example, the depression 703B in the pallet 702B is sized to receive the wafer 204 and has a depth 717B substantially greater than a thickness of the wafer 204. For example, the depression 703B may have a depth 717B that is greater than the thickness of the wafer 204 to be processed by a factor of 2-20. Therefore, as illustrated in FIG. 7B, the wafer sits at a substantially recessed position relative to the top surface of the pallet 702B. In one example, the depression 703B has a depth greater than or equal to 0.5 cm. Other embodiments may include depressions having other depths. According to embodiments, pallets having deeper pockets may minimize damage to the front side of the wafer by, for example, decreasing the ions, particles, and/or high energy rays that reach the front side of the wafer. Therefore, embodiments may result in wafers with improved UV behavior.

Thus, FIGS. 2-7B illustrate embodiments of wafer processing systems and pallets for use in wafer processing systems. The above described embodiments may be implemented separately or in combination, and may improve the UV properties of wafers processed in accordance with those embodiments.

Embodiments may also (or alternatively) include other features that may improve UV behavior. For example, embodiments may include walls or shields between pallets and on the sides of the pallets. For example, the wafer pallet 108 of FIG. 1 may further include walls along part or all of the perimeter of the pallet 108. The walls may be located at or near the outer edges of the pallet and extend above the top surface of the pallet. The walls may be arranged to form a box, which may help contain the plasma and prevent damage to the side of the wafer that is not being processed.

In another example, a processing system may include a stand to elevate the wafer from the pallet. In an embodiment including a pallet with depressions to hold the wafers (e.g., the wafer pallet 108 of FIG. 1), a stand may be located in the depression in the pallet to support the wafer in the depression. For example, in an embodiment where the wafer would typically sit in the depression and contact the bottom of the depression, the stand has a height to form a gap between the bottom of the depression and the wafer. A stand may also be used to form a gap between the pallet and the wafer in an embodiment without pockets. A stand may elevate the wafer away from the pallet a sufficient amount to permit vapor flow beneath the wafer. Thus, embodiments may prevent significant damage from water vapor without relying on an opening (such as the opening 206 of FIG. 2) in the pallet below the wafer. Therefore, water vapor issues may be circumvented without introducing problems related to open pockets.

Embodiments may also include a grounding mechanism to contact and ground the wafers to be processed. For example, a pallet (e.g., the pallet 108 of FIG. 1) may include metal fingers that contact solder pads of the wafers to ground the wafer during processing. Grounding the wafer may reduce potential differences that could cause current to flow through the front surface of the wafer. In an embodiment with a pallet having pockets, such metal fingers may be located in the depression, such as on the edges that support the wafer in the depression.

In one embodiment, longer grounding rods may be used to lower the voltage of the plasma. Embodiments may also involve RF sputtering, soft sputtering, or metal evaporation to potentially reduce e-sputter damage.

As mentioned above, some embodiments include pallets without pockets. For example, in one embodiment, a solid pallet has a flat surface without pockets. When the wafers are loaded onto the pallet, there are no holes between the wafers, and the surface of the pallet is sized such that it extends out past the edge of the loaded wafers. Such solid pallet embodiments with edges that extend out past the wafers may at least partially block UV radiation, and therefore result in wafers with improved UV behavior (e.g., decreased UV degradation in solar cells).

Any of the above-described embodiments may be included in a wafer-processing system, such as the sputter tool described with respect to FIG. 1, or another processing system using a pallet. In one embodiment, a wafer-processing system includes a processing chamber, which may be similar to or the same as the deposition chamber 101 described above. The wafer-processing system further includes a pallet in accordance with one of the embodiments of the disclosure. For example, in the embodiment illustrated in FIG. 2, the pallet 202 includes a depression 201 to receive the wafer 204, an opening 206 below the depression, and an edge 210 in the depression 201 is to support the wafer 204 over the opening 206. A cover 208 at least partially covers the opening 206. Other system embodiments may include other pallet features described herein.

Figure 8:
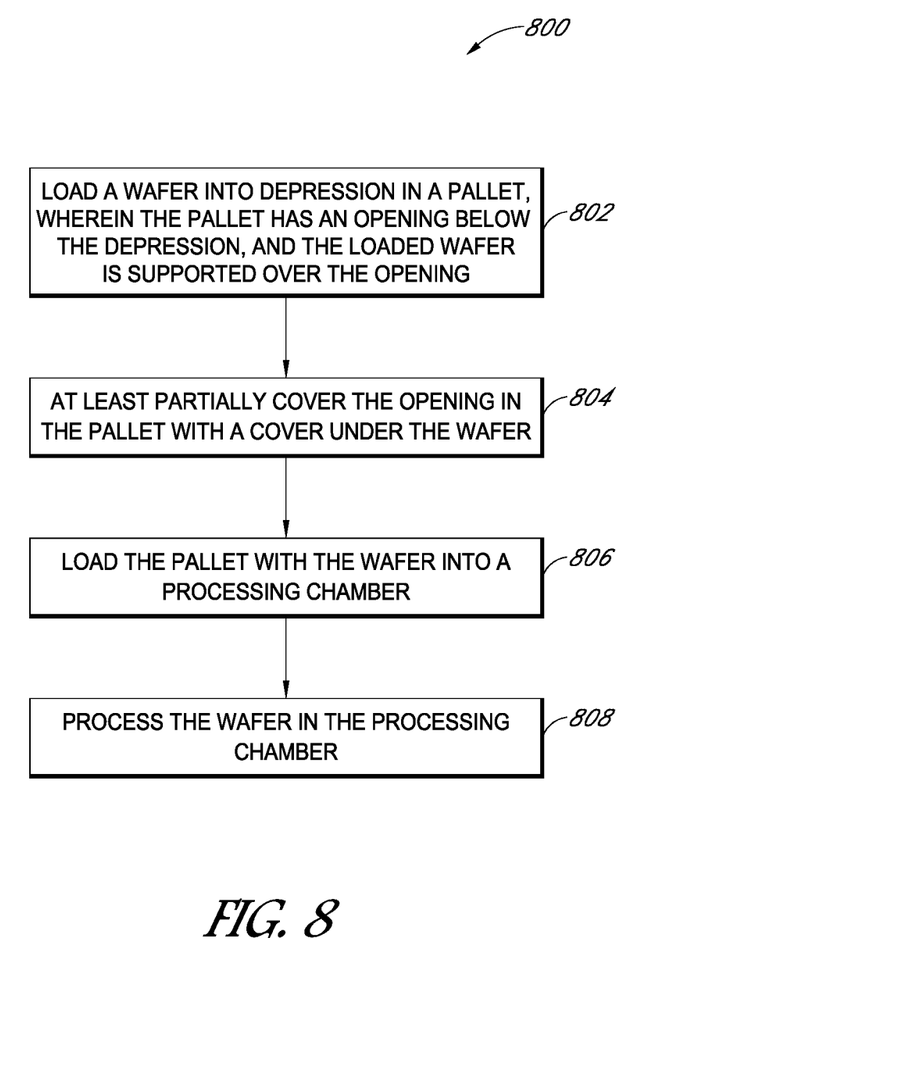
FIG. 8 is a flowchart illustrating operations in a method of processing a wafer, in accordance with embodiments of the present disclosure.

Methods of wafer-processing may be performed using one or more of the embodiments described above. For example, FIG. 8 is a flowchart illustrating operations in a method of processing a wafer, in accordance with embodiments of the present disclosure. The method 800 illustrates wafer processing using a system such as FIG. 1, and further using a pallet with a covered pocket, such as the pallet illustrated in FIG. 2. Therefore, the method 800 is described primarily with respect to FIGS. 1 and 2. However, a similar method may be performed with other embodiments described herein.

The method 800 begins at operation 802, with loading a wafer into a depression 201 in a pallet. For example, referring to FIG. 2, the pallet 202 includes an opening 206 below the depression 201, and the loaded wafer 204 is supported on an edge 210 in the depression 201 over the opening 206.

The opening 206 is at least partially covered by a cover 208. In an embodiment where the cover is removable, the method 800 may involve covering the opening 206 in the pallet 202 with the cover 208, at operation 804. In an embodiment where the cover is attached to or a part of the pallet 202, the opening 206 in the pallet 202 may be covered by default and thus the method may not involve a covering operation. In an example where the cover 208 has holes, such as the embodiment illustrated in FIG. 3, loading the wafer into the depression may involve lowering the wafer into the depression with a pedestal through the opening in the pallet and through one or more holes in the cover.

At operation 806, the pallet with the wafer is then loaded or transferred into the processing chamber 101. The processing chamber 101 is typically a vacuum chamber, therefore the loaded pallet 202 typically passes through load locks prior to the processing chamber 101.

At operation 808, the wafer is processed in the processing chamber 101. For example, a sputtering process may be performed to deposit a metal seed layer on the wafer, such as the process described above with respect to FIG. 1. In the example described in FIG. 8, the opening 206 in the pallet 202 covered during processing. As mentioned above, the covering the opening in the pallet with the cover 208 may result in improved UV behavior of the wafer 204. After processing, the method 800 may further involve unloading the wafer from the pallet and unloading the pallet from the processing chamber.

Figure 10:
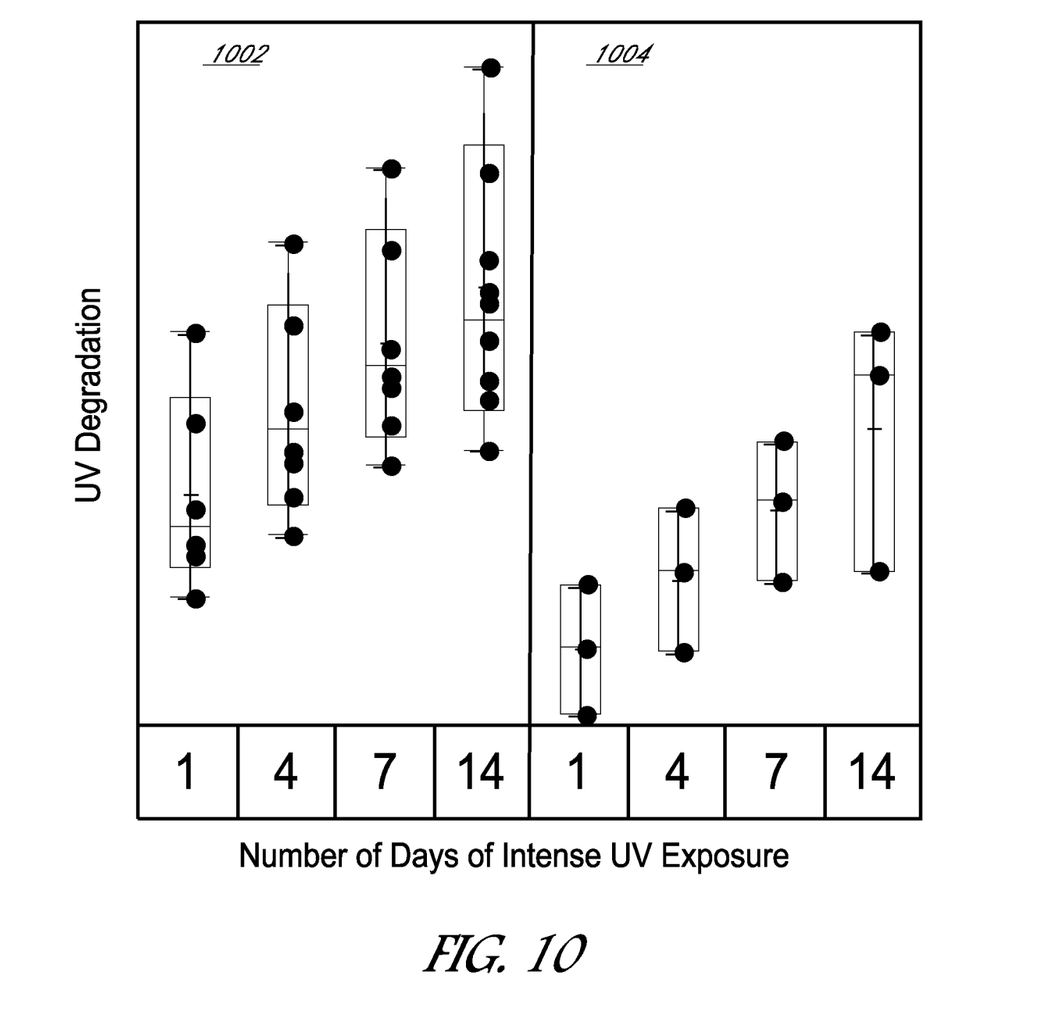
FIG. 10 depicts graphs of the UV degradation of solar cells produced using a conventional sputter tool and solar cells produced using a sputter tool in accordance with an embodiment of the present disclosure.

FIG. 10 depicts graphs of the UV degradation of solar cells produced using a conventional sputter tool and solar cells produced using a sputter tool in accordance with an embodiment of the present disclosure. The solar cells were subject to 14 days of intense UV exposure, and UV degradation was measured at 1, 4, 7, and 14 days. The graph 1002 on the left side was collected using solar cells produced using a conventional sputter tool. The graph 1004 on the right side was collected using solar cells produced using a sputter tool in accordance with an embodiment of the present disclosure. As can be seen from the graphs 1002 and 1004, the solar cells produced using a sputter in accordance with an embodiment of the present disclosure exhibit notably decreased UV degradation.

Thus, sputter tools have been disclosed. Embodiments enable production of solar cells having improved UV behavior, such as decreased UV degradation when exposed to intense UV radiation.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus to support a wafer in a wafer-processing system, the apparatus comprising:
   a cathode;
   a pallet comprising:
      a plurality of depressions to receive a corresponding plurality of wafers in a wafer processing region of the pallet,
      wherein the pallet further comprises a corresponding opening below each of the plurality of depressions, and
      wherein an edge in each of the depressions is to support the corresponding wafer over the corresponding opening; and
   a plurality of covers to at least partially cover each of the corresponding openings, the plurality of covers separated from the cathode, wherein the cathode is above the wafer processing region of the pallet, and the wafer processing region of the pallet is above the plurality of covers, each of the plurality of covers is located between vertically opposing beveled edges, and wherein the cathode comprises targets of material for sputtering into the wafer processing region.

2. The apparatus of claim 1, wherein each of the plurality of covers is disposed in the corresponding depression over the corresponding opening and below the corresponding wafer.

3. The apparatus of claim 2, wherein each of the plurality covers comprises a plate with one or more holes.

4. The apparatus of claim 3, further comprising:
a pipe below each of the one or more holes in each of the plurality covers.

5. The apparatus of claim 1, wherein each of the plurality covers comprises a metal plate.

6. The apparatus of claim 1, wherein each of the plurality covers is supported on the edge in the corresponding depression in a plane below the corresponding wafer.

7. The apparatus of claim 1, wherein:
the edge in each of the plurality of depressions comprises a lip with a downward slanted top surface sized to support the corresponding wafer.

8. The apparatus of claim 7, wherein each of the plurality of covers is coupled to the lip in a position lower than the corresponding wafer to form a gap between the corresponding cover and the corresponding wafer.

9. The apparatus of claim 1, further comprising one or more walls along outer edges of the pallet, wherein the one or more walls extend above a top surface of the pallet.

10. The apparatus of claim 1, further comprising a stand in each of the plurality of depressions to support the corresponding wafer in the corresponding depression, wherein the stand has a height to form a gap between a bottom of the corresponding depression and the corresponding wafer.

11. The apparatus of claim 1, further comprising metal fingers in each of the plurality of depressions to ground the corresponding wafer.

12. The apparatus of claim 1, further comprising a heating element to heat the pallet.

13. The apparatus of claim 1, wherein each of the corresponding openings comprises a hole through an entire thickness of the pallet, and wherein the hole is sized to receive a pedestal to load and unload the corresponding wafer.

14. The apparatus of claim 1, wherein the cathode is positioned on a side of the supported wafers opposite a side facing the plurality of covers.

15. A wafer-processing system comprising:
a processing chamber;
a cathode;
a pallet comprising:
a plurality of depressions to receive a corresponding plurality of wafers in a wafer processing region of the pallet,
wherein the pallet further comprises a corresponding opening below each of the plurality of depressions, and
wherein an edge in each of the depressions is to support the corresponding wafer over the corresponding opening; and
a plurality of covers to at least partially cover each of the corresponding openings, the plurality of covers separated from the cathode, wherein the cathode is above the wafer processing region of the pallet, and the wafer processing region of the pallet is above the plurality of covers, each of the plurality of covers is located between vertically opposing beveled edges, and wherein the cathode comprises targets of material for sputtering into the wafer processing region.

16. The wafer-processing system of claim 15, wherein the wafer-processing system is a sputter deposition system, and wherein the system further comprises:
one or more targets above the pallet; and
a carrier to carry the pallet through the system.

17. The wafer-processing system of claim 15, wherein each of the plurality of covers is disposed in the corresponding depression over the corresponding opening and below the corresponding wafer.

18. The wafer-processing system of claim 15, wherein each of the plurality of covers comprises a plate with one or more holes.

19. The wafer-processing system of claim 15, wherein the cathode is positioned on a side of the supported wafers opposite a side facing the plurality of covers.

* * * * *